(12) United States Patent
Perera et al.

(10) Patent No.: US 8,530,995 B2
(45) Date of Patent: Sep. 10, 2013

(54) HIGH OPERATING TEMPERATURE SPLIT-OFF BAND INFRARED DETECTOR WITH DOUBLE AND/OR GRADED BARRIER

(75) Inventors: A.G. Unil Perera, Mableton, GA (US); Steven G. Matsik, Hendersonville, NC (US)

(73) Assignee: Georgia State University Research Foundation, Inc., Atlanta, GA (US)

( * ) Notice: Subject to any disclaimer, the term of this patent is extended or adjusted under 35 U.S.C. 154(b) by 200 days.

(21) Appl. No.: 13/147,646

(22) PCT Filed: Feb. 3, 2010

(86) PCT No.: PCT/US2010/022982
§ 371 (c)(1),
(2), (4) Date: Sep. 9, 2011

(87) PCT Pub. No.: WO2010/091042
PCT Pub. Date: Aug. 12, 2010

(65) Prior Publication Data
US 2011/0315958 A1    Dec. 29, 2011

Related U.S. Application Data

(60) Provisional application No. 61/149,599, filed on Feb. 3, 2009.

(51) Int. Cl.
*H01L 31/102* (2006.01)
(52) U.S. Cl.
USPC ........... 257/451; 257/191; 257/196; 257/428; 257/E31.003; 257/E31.004; 257/E31.019; 257/E31.02; 257/E31.021; 438/57; 438/63
(58) Field of Classification Search
USPC .................. 257/191, 196, 428–466, E31.003, 257/E31.004, E31.019, E31.02, E31.021; 438/57–98
See application file for complete search history.

(56) References Cited

U.S. PATENT DOCUMENTS

| 5,253,264 | A | 10/1993 | Suzuki et al. |
| 5,296,721 | A | 3/1994 | Schulman et al. |
| 5,747,862 | A | 5/1998 | Kishino et al. |
| 2008/0054251 | A1 | 3/2008 | Perera et al. |

OTHER PUBLICATIONS

Jayaweera et al., "Spin split-off transition based IR detectors operating at high temperatures", Sep. 29, 2006, Infrared Physics & Technology 50 (2007) 279-283.*
Nguyen et al., "Very high performance LWIR and VLWIR Type-II InAs/GaSb superlattice photodiodes with M-structure barrier", 2008, Proc. of SPIE vol. 7082, 708205, (2008).*
Lee et al., "Quantum-well infrared photodetectors with digital graded superlattice barrier for long-wavelength and broadband detection", Nov. 15, 1999, Applied Physics Letters, vol. 75, No. 20.*
The International Search Report and Written Opinion dated Mar. 31, 2010.

* cited by examiner

*Primary Examiner* — Kimberly Rizkallah
*Assistant Examiner* — Maria Ligai
(74) *Attorney, Agent, or Firm* — Thomas Horstemeyer, LLP

(57) ABSTRACT

A high operating temperature split-off band infrared (SPIP) detector having a double and/or graded barrier on either side of the emitter is provided. The photodetector may include a first and second barrier and an emitter disposed between the first and second barriers so as to form a heterojunction at each interface between the emitter and the first and second barriers, respectively. The emitter may be of a first semiconductor material having a split-off response to optical signals, while one of the first or the second barriers may include a double barrier having a light-hole energy band level that is aligned with the split-off band energy level of the emitter. In addition, the remaining barrier may be graded.

23 Claims, 18 Drawing Sheets

HIGH OPERATING TEMPERATURE SPLIT-OFF BAND INFRARED DETECTOR WITH DOUBLE AND/OR GRADED BARRIER

CROSS-REFERENCE TO RELATED APPLICATION

This application claims priority to the PCT application entitled "HIGH OPERATING TEMPERATURE SPLIT-OFF BAND INFRARED DETECTOR WITH DOUBLE AND/OR GRADED BARRIER," having serial number PCT/US2010/022982, filed on Feb. 3, 2010. This application also claims priority to and benefit of U.S. Provisional Patent Application No. 61/149,599, filed on Feb. 3, 2009, which is incorporated by reference in its entirety.

FIELD

Embodiments of the invention relate, generally, to infrared detectors and, in particular, to high operating temperature infrared detectors.

BACKGROUND

The at or near room temperature detection of infrared radiation is becoming important in a wide range of applications in the civilian, industrial, medical, astronomical and military sectors. Infrared radiation can be detected by photon detectors and thermal detectors. However, excessive dark current levels can impede reliable detection of radiation by infrared detectors. Dark current is the background noise generated by thermal activity in a photodetector. In the semiconductor materials used in photodetectors, the dark current typically increases with temperature. Hence, the dark current effectively determines an operating temperature limit for a detector of well below room temperature. It is common for cooling temperatures to be at or below 77 degrees Kelvin (77 K). This can require a substantial cooling system to reduce detector temperatures to the necessary level.

One proposed solution to the foregoing limitations is the split-off infrared photodetector (SPIP) detector described in U.S. application Ser. No. 11/849,464 ("the '464 application"), entitled, "High Operating Temperature Split-Off Band Infrared Detector," the contents of which are hereby incorporated herein by reference in their entirety. As described in more detail below, the SPIP detector described in the '464 application can comprise multiple periods of an emitter disposed between two barriers so as to form a heterojunction at each interface between the emitter and the first and second barriers, wherein the emitter is of a semiconductor material that is different from that of the barriers and has a split-off response to optical signals and a cutoff wavelength.

A limiting factor on the quantum efficiency, or gain, of the SPIP detector described in the '464 application, however, may be the trapping of carriers due to scattering between hot and cold carriers as they pass through the emitter layers of the detector. A need, therefore, exists for a technique to reduce this trapping and, as a result, improve the quantum efficiency of the IR detector, while maintaining the high operating temperature.

BRIEF SUMMARY

Embodiments of the present invention provide an improvement by, among other things, providing a high operating temperature split-off band infrared (SPIP) detector having a double and/or graded barrier on either side of the emitter.

In particular, in accordance with one aspect, a high operating temperature photodetector is provided, wherein the photodetector may include a first and second barrier and an emitter disposed between the first and second barriers so as to form a heterojunction at each interface between the emitter and the first and second barriers, respectively. In one embodiment, the emitter may be of a first semiconductor material having a split-off response to optical signals, while one of the first or the second barriers may include a double barrier having a light-hole energy band level that is aligned with the split-off band energy level of the emitter. In addition, according to one embodiment, the remaining barrier may be graded.

In one embodiment, the double barrier may include a first and a second sub-barrier, with a well disposed between the two. The first and second sub-barriers may be made of a second semiconductor material having a first bandgap, while the well may be made of a third semiconductor material having a second bandgap. According to one embodiment, one or more of the height of the sub-barriers, the base level of the well, or the thickness of the well may be selected in order to align the light-hole energy band level of the double barrier with the split-off band energy level of the emitter.

According to one embodiment, the second and third semiconductor materials may include a first group III element, a second group III element, and a first group V element, wherein the height of the sub-barriers and the base level of the well may be selected by adjusting a fraction of the first group III element in the second and third semiconductor materials, respectively. In particular, according to one embodiment, the second semiconductor material may comprise $Al_xGa_{(1-x)}As$, while the third semiconductor material may comprise $Al_{(1-x)}Ga_xAs$, wherein $0<x<1$, wherein x may be selected based on the desired sub-barrier height and/or well base level.

Similarly, in one embodiment, the graded barrier may be of a fourth semiconductor material, such as $Al_xGaAs$, wherein $0<x<1$ and x is graded.

In accordance with another aspect, a method is provided of making a high operating temperature photodetector. In one embodiment, the method may include: (1) providing a first barrier; (2) disposing an emitter on the first barrier to form a heterojunction at a first interface between the emitter and the first barrier, the emitter comprising a first semiconductor material having a split-off response to optical signals and the first barrier comprising a double barrier having a light-hole energy band level aligned with a split-off energy band level of the emitter; and (3) disposing a second barrier on the emitter to form a heterojunction at a second interface between the emitter and the second barrier, the second barrier comprising a second graded semiconductor material.

In one embodiment, providing the first barrier may further include providing a first sub-barrier comprising a third semiconductor material having a first bandgap; disposing a layer of a fourth semiconductor material on the first sub-barrier to form a well, the fourth semiconductor material having a second bandgap; and disposing a second sub-barrier on the well, the second sub-carrier comprising the third semiconductor material having the first bandgap.

The method of one embodiment may further include selecting one or more of a height of the first and second sub-barriers, a base level of the well, or a thickness of the well in order to align the light-hole energy band level of the double barrier with the split-off band energy level of the emitter. In particular, according to one embodiment, the third and fourth semiconductor materials may include a first group III element selected from a group consisting of Al, Ga, In, and combinations thereof, a second group III element selected from a group consisting of Al, Ga, In, and combinations thereof, and a first group V element selected from a group consisting of N, P, As, Sb, and combinations thereof. In this embodiment, selecting a height of the first and second sub-barriers may include adjusting a fraction of the first group III element in the third semiconductor material, and selecting a base level of the well may include adjusting a fraction of the first group III element in the fourth semiconductor material.

BRIEF DESCRIPTION OF THE SEVERAL VIEWS OF THE DRAWING(S)

Having thus described embodiments of the invention in general terms, reference will now be made to the accompanying drawings, which are not necessarily drawn to scale, and wherein:

Figure 10A:
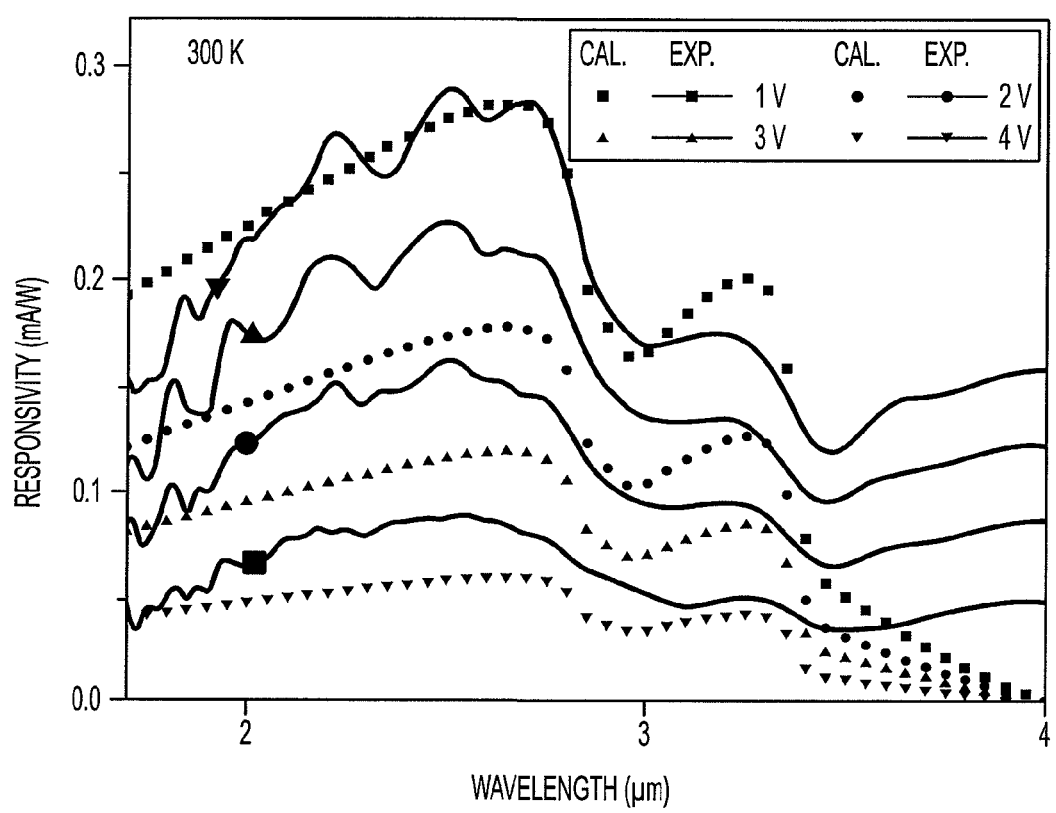
Figure 10B:
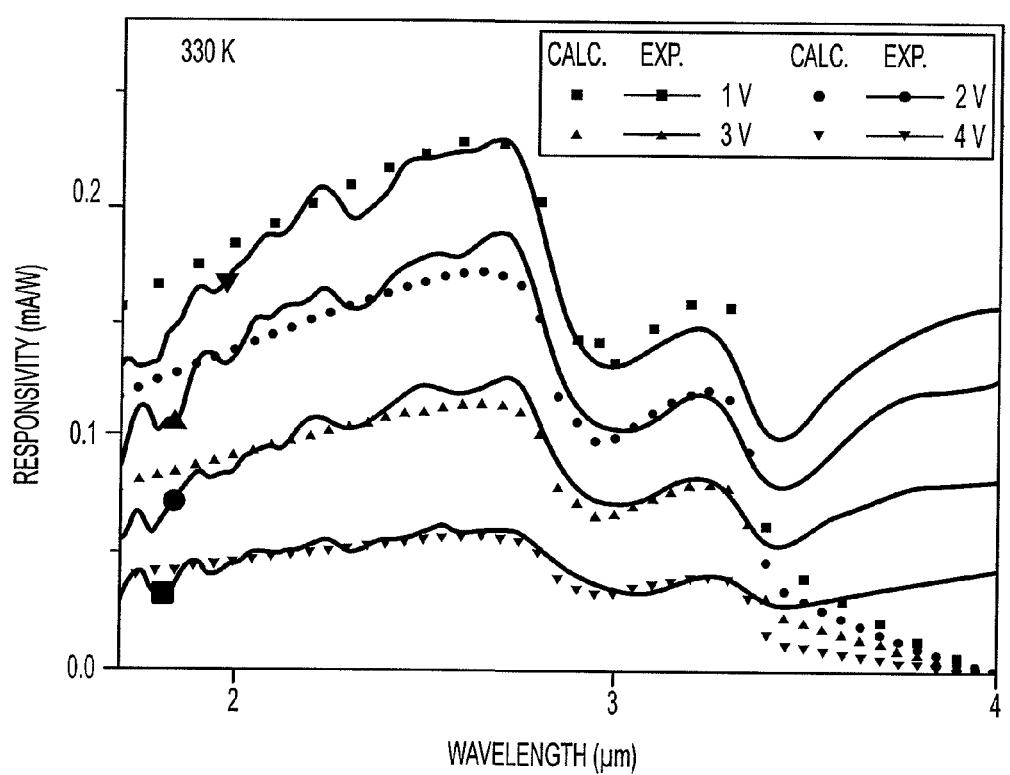

FIGS. 10A and 10B illustrate the measured spectra and the calculated response for an SPIP detector of embodiments described herein under 1, 2, 3 and 4 V biases at 300 and 330 K, respectively.

Figure 11:
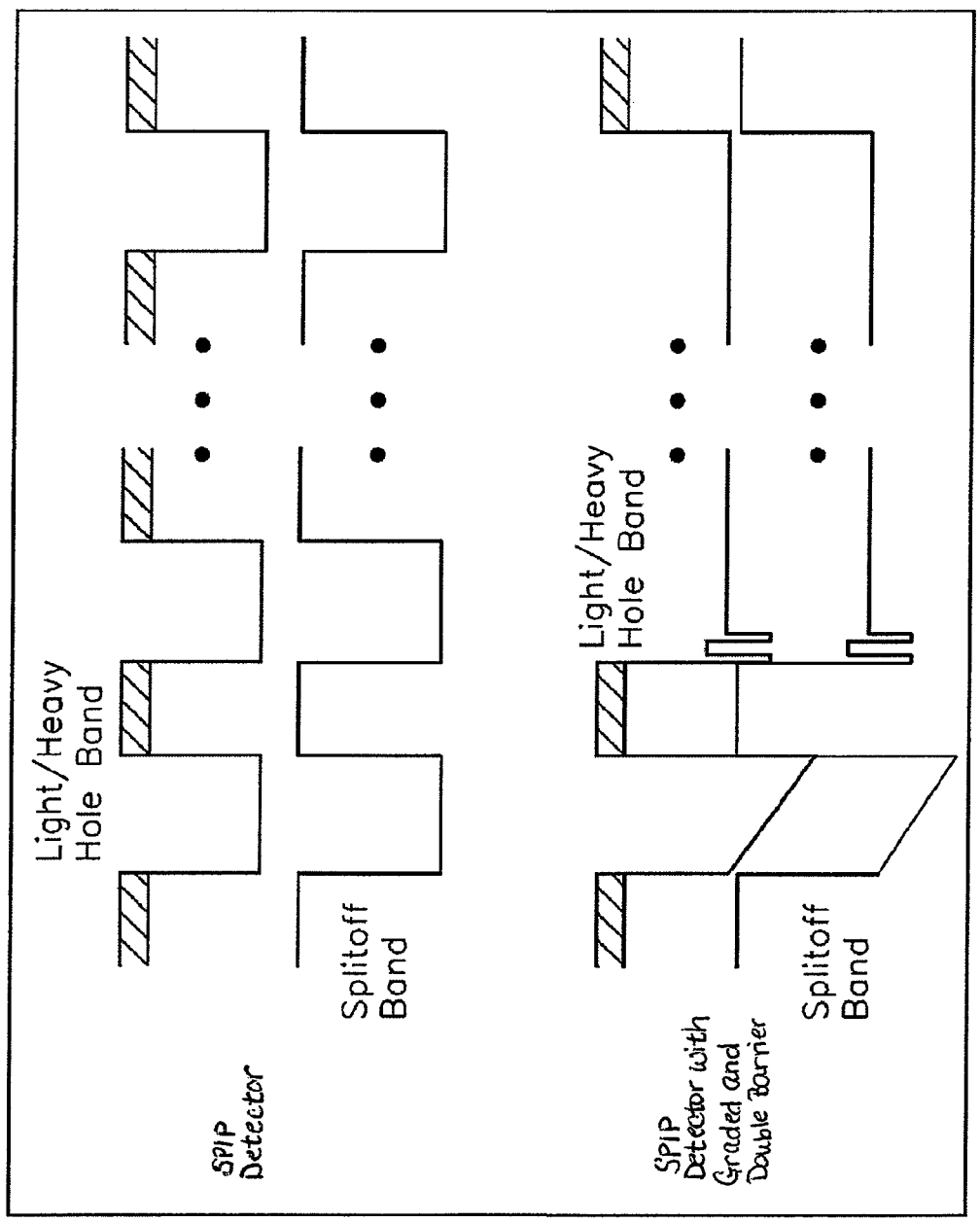

FIG. 11 illustrates a band diagram for the SPIP detector with and without graded and double barriers showing the light/heavy (thick line) and split-off (thin line) band edges under zero bias.

Figure 12:
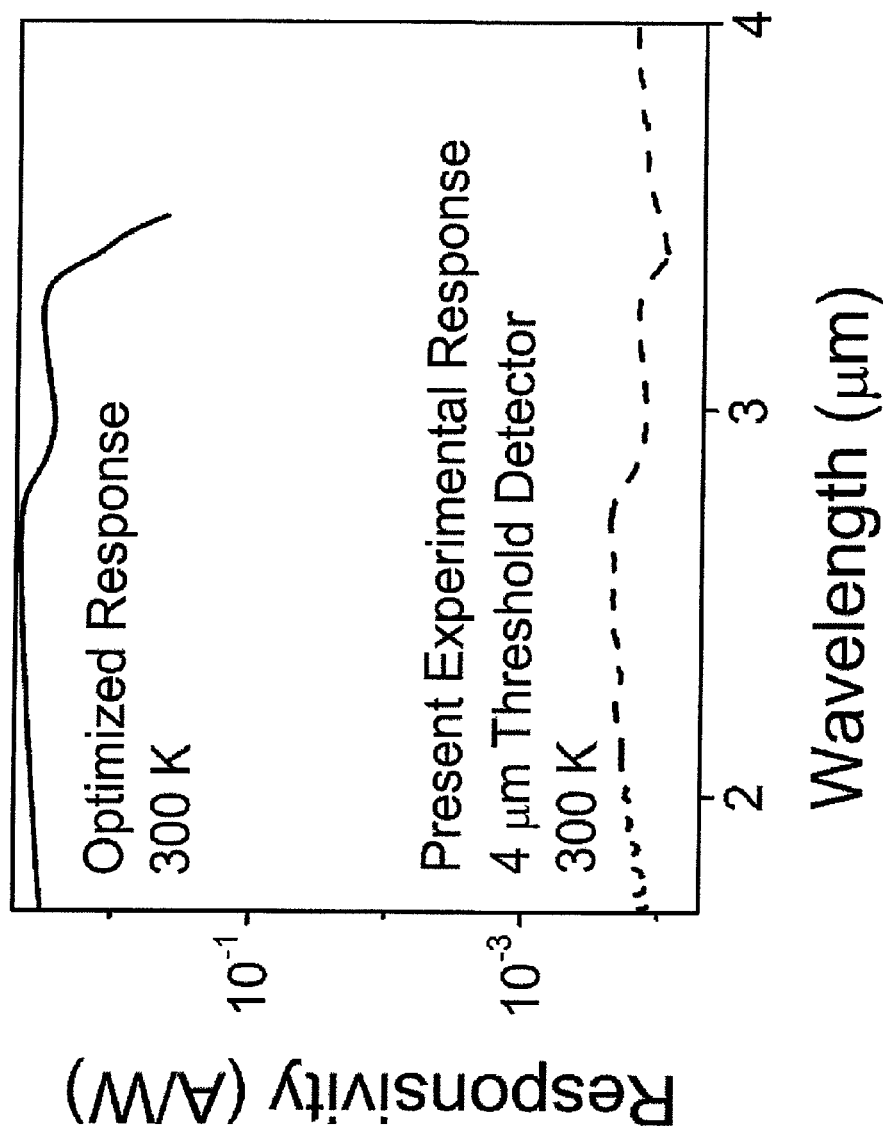

FIG. 12 illustrates the calculated response for an SPIP detector with graded and double barriers of embodiments described herein.

Figure 13:
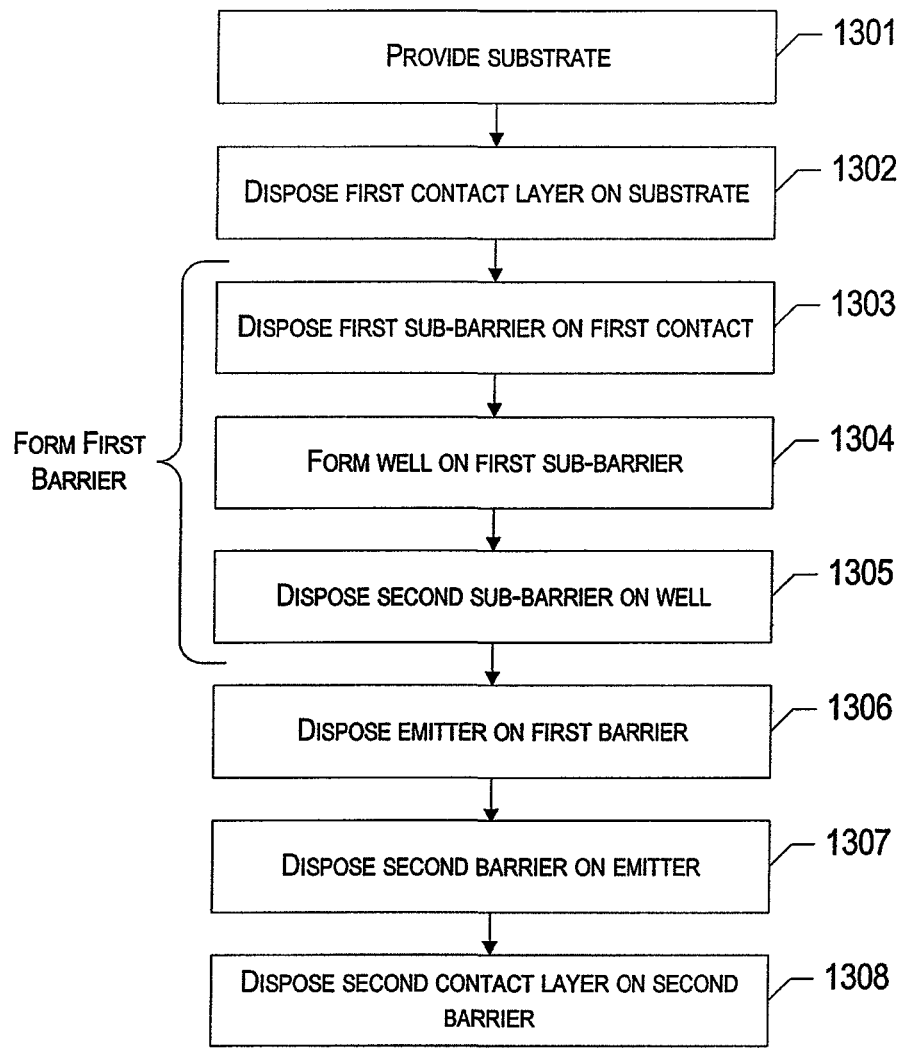

FIG. 13 is a flow chart illustrating the steps that may be taken in order to make an SPIP detector of embodiments described herein.

DETAILED DESCRIPTION

Embodiments of the present invention now will be described more fully hereinafter with reference to the accompanying drawings, in which some, but not all embodiments of the inventions are shown. Indeed, embodiments of the invention may be embodied in many different forms and should not be construed as limited to the embodiments set forth herein; rather, these embodiments are provided so that this disclosure will satisfy applicable legal requirements. Like numbers refer to like elements throughout.

Figure 1:
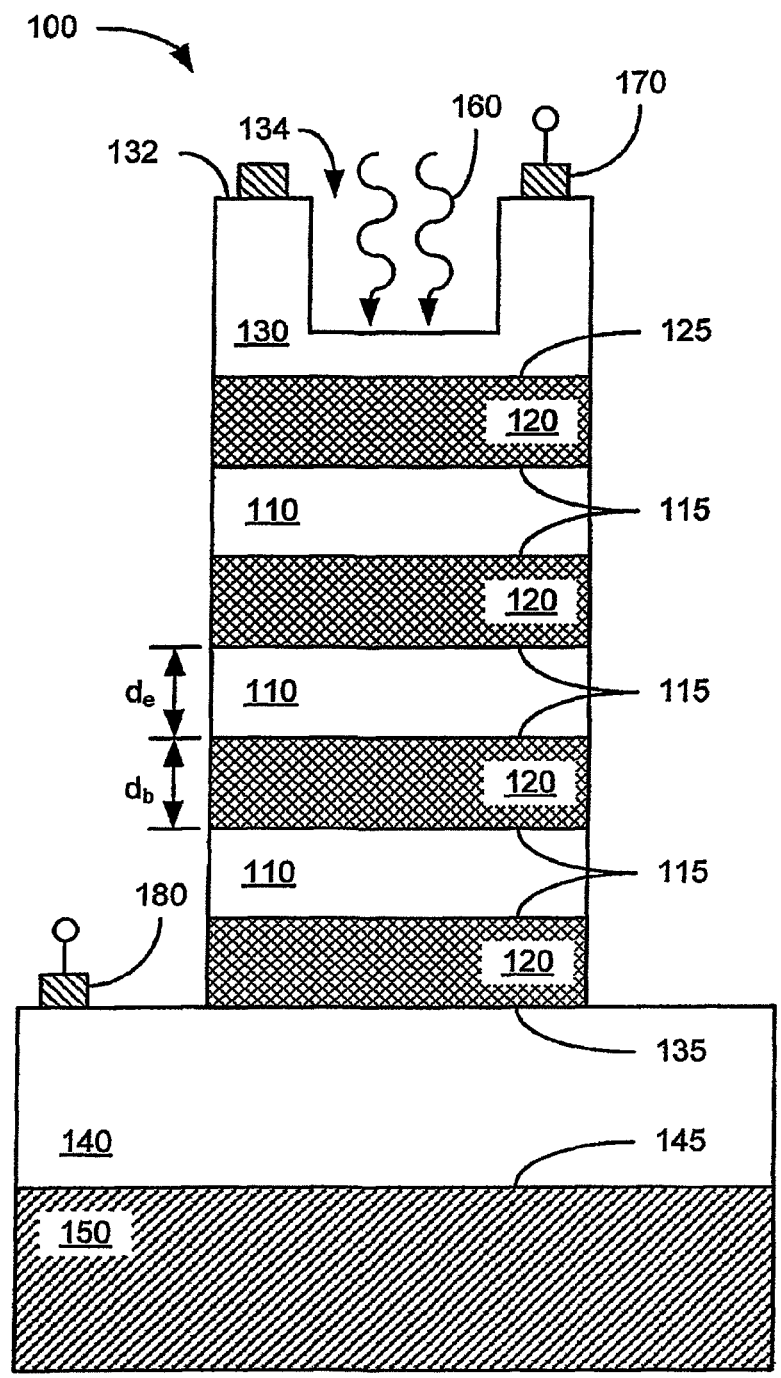
FIG. 1 illustrates an embodiment of a Split-off Infrared Photodetector (SPIP) detector.

High Operating Temperature Split-Off Band Infrared Detector:

As noted above, one technique for providing at or near room temperature detection of IR radiation is through the use of the high operating temperature split-off band infrared or photodetector (SPIP) detector described in U.S. application Ser. No. 11/849,464 ("the '464 application"). In particular, FIG. 1 illustrates an embodiment of a SPIP detector 100 of the '464 application. In a SPIP detector, a heterojunction may be formed by two different electrical types of two chemically different materials with each material having a bandgap different from that of the other. An example of a heterojunction is a GaAs/Al$_x$Ga$_{(1-x)}$As junction, where x is a number satisfying 0<x<1. The design is analogous to a Heterojunction Interfacial Workfunction Internal Photoemission (HEIWIP) detector that has been optimized for split-off band response. However, the detection mechanism may differ from that used in the HEIWIP detectors. A description of HEIWIP detectors is provided in U.S. Pat. No. 7,253,432, issued on Aug. 7, 2007, entitled "Heterojunction Far Infrared Photodetector," which is incorporated herein by reference.

In general, the HEIWIP detector can have several emitter layers 110 and barrier layers 120 sandwiched between first and second contact layers, 130 and 140 respectively. The total number of barrier layers 120 is N, where N is an integer greater than 1. In the exemplary embodiment illustrated in FIG. 1, the total number of barriers 120 is N=4. Note that, in another embodiment (not shown), a single emitter positioned between two barriers is workable.

Each barrier 120 may be a layer of a material made from a first group III element (e.g., Al, Ga, In, and combinations thereof), a second group III element (e.g., Al, Ga, In, and combinations thereof), and a first group V element (e.g., N, P, As, Sb, and combinations thereof). The barrier 120 may be further characterized by a bandgap. The construction parameters of each barrier 120 can include, but are not limited to, the chemical identities of the first and second group III elements and the first group V element, the thickness of the barrier layer 120, the relative concentration of the first and second group III elements, the bandgap of the barriers 120, and the total number N of the barriers 120.

In one embodiment, among others, the first group III element may be Al, the second group III element may be Ga, and the first group V element may be As. The concentration of the first group III element, Al, may be characterized by a normalized amount x, x being in the range of 0 to about 1, about 0.05 to 0.50, and about 0.16 to 0.30; and the concentration of the second group III element, Ga, may characterized by a normalized relative amount 1−x. The thickness of each barrier layer 120, identified as d$_b$ in FIG. 1, can range from about 400 to 4000 Å, about 500 to 1000 Å, and about 600 to 800 Å.

The photodetector 100 may further have emitter layers 110, the total number of emitters is N−1. In the exemplary embodiment illustrated in FIG. 1, the total number of emitters 110 is N−1=3. Each emitter 110 may be a layer of material made from a third group III element (e.g., Al, Ga, In, and combinations thereof) and a second group V element (e.g., N, P, As, Sb, and combinations thereof). The emitter 110 may be further characterized by a bandgap different from that of the barriers 120, wherein each emitter 110 may be located between two barriers 120 so as to form a heterojunction at each interface 115 between an emitter 110 and a barrier 120. Moreover, each emitter 110 may be doped to cause free carriers in the emitter 110 by adding a doping element including, but not limited to, group II elements (e.g., Be, Mg, and combinations thereof) and/or group IV elements (e.g., C, Si, Ge, Sn, and combinations thereof). The construction parameters of each emitter 110 can include the chemical identities of the third group III element, the second group V element, and the doping element from the group II, IV or VI elements, the thickness of the emitter layer 110, the doping concentration of the doping element, the bandgap of the emitters 110, and the total number N−1 of the emitters 110.

In one embodiment, among others, the third group III element may be Ga, the doping element may be the group II element Be, and the second group V element may be As. The thickness of each emitter layer 110, identified as $d_e$ in FIG. 1, can be about 150 to 700 Å, about 150 to 400 Å, and about 150 to 200 Å. The doping concentration of the doping element can be about $1 \times 10^{17}$ to $5 \times 10^{19}$ cm$^{-3}$, about $3 \times 10^{17}$ to $1 \times 10^{19}$ cm$^{-3}$, and about $1 \times 10^{18}$ to $1 \times 10^{19}$ cm$^{-3}$. The split-off bandgap of each emitter 110 can be characterized by a workfunction ($\Delta_{SO}$) substantially from about 3 to 800 meV, about 19 to 390 meV, and about 280 to 390 meV. The interface 115 of each emitter 110 with each barrier 120 can be characterized by a workfunction ($\Delta$) substantially about 15 to 400 meV, about 60 to 400 meV, and about 200 to 400 meV. By having these two workfunctions similar to each other the optimum operating temperature could be achieved. By having workfunction ($\Delta$) of an interface roughly equal to twice the workfunction ($\Delta_{SO}$) of the adjacent emitter the response of the photodetector 100 can be maximized.

In addition, the photodetector 100 may have a first contact layer 130 in contact with one outermost barrier 120 at interface 125. The photodetector 100 may also have a second contact layer 140 in contact with the opposite outermost barrier 120 at interface 135. The first contact layer 130 and the second contact layer 140 may be made from materials substantially identical to the material from which emitters 110 are made. Depending on the doping required for ohmic contacts, the first contact 130 may also serve as a top emitter layer. The photodetector 100 may further have a substrate 150 in contact with the second contact layer 140 at interface 145. The substrate 150 may be made from a material compatible with the material from which the emitters 110 and barriers 120 are made but may be either undoped or doped.

The first contact layer 130 may have a first surface 132, opposite interface 125, and an opening 134 defined in the first surface 132 to receive optical signals 160. The opening 134 may be formed by partially etching the first surface 132 of the first contact layer 130. Moreover, conductive contacts 170 and 180 located at the first and second contact layers 130 and 140, respectively, can be utilized for measuring the response of the photodetector 100 to the incoming optical signals 160.

Figure 2:
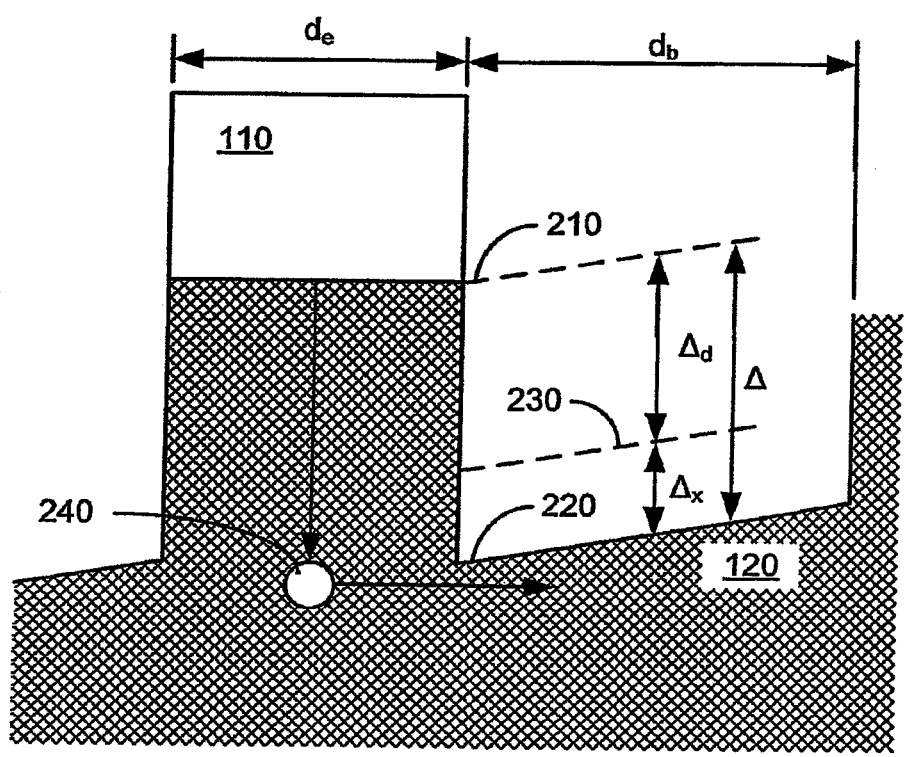
FIG. 2 is an illustration of an exemplary p-type band diagram for a single period of a SPIP detector.

FIG. 2 is an illustration of an exemplary p-type band diagram for a single period of a SPIP detector. The workfunction, indicated as $\Delta$ in FIG. 2, of each emitter 110 can be defined as the difference between the three dimensional Fermi level 210 of the emitter 110 and the conduction band 220 of a corresponding barrier 120. The workfunction can be given by $\Delta = \Delta_d + \Delta_x$, where $\Delta_d$ and $\Delta_x$ are the contributions from doping of the emitter 110 and the difference fraction of the first group III element of the emitter 110 and the barrier 120, respectively. In an exemplary embodiment utilizing a barrier of $Al_xGa_{1-x}As$ and a p-doped emitter of GaAs, $\Delta_d$ represents the contribution of the emitter 110 doping and $\Delta_x$ represents the contribution of the Al fraction (x) in the barrier 120. As the Al fraction (x) of the barrier 120 is reduced, $\Delta$ will be limited by $\Delta_d$. In the case where the Al is eliminated (i.e., x=0), the interface 115 (see FIG. 1) between the emitter 110 and barrier 120 is a homojunction. The dashed line 230 indicates the valence-band edge if the barrier 120 material were only GaAs (i.e., a homojunction detector). By adjusting and the fraction of the first group III element of the barrier 120 and/or the doping density of the emitter 110, the workfunction ($\Delta$) can be tailored to provide a desired bandgap. The resulting structure has sharp interfaces between the layers of material reducing dark current and detector noise The emitters 110 may be doped to a sufficiently high level so that the carriers 240 form a 3-dimensional distribution in the emitters 110 and detection is by free carrier absorption. By adjusting the fraction of the first group III element of the barrier 120 and/or the doping density of the emitter 110, the detection range can be tailored to any desired wavelength. The cutoff wavelength can be adjusted at integer or non-integer multiples of the wavelength detection range of a detector (e.g., the cutoff wavelength can be four, three, two or 1.3 times the upper limit of the wavelength detection range). In one embodiment, among others, the barriers 120 can have a low Al fraction (x) so that the workfunction (A in FIG. 2) will be small to allow operation at far infrared (FIR) wavelengths. Increasing the doping in the emitter layers 110 can increase the absorption in the emitters 110, but it will also increase the dark current of the detector 100. Doping of the emitter layers 110 balances the dark current effect and the absorption quantum efficiency in the emitter layers 110.

HEIWIP detectors designed for the middle infrared (MIR) and FIR ranges also exhibit near infrared (NIR) response peaks. In general, the wavelength ($\lambda$) range for the NIR is less than about 5 μm for GaAs/AlGaAs based detectors. These peaks are created by split-off band effects and appear on top of the free carrier response region. These relatively strong split-off responses can be seen up to 130 K, while the free carrier response disappeared beyond 40 K. The split-off band IR detectors can be based on four detection mechanisms, with each depending upon three processes: (i) the photoabsorption that generates excited carriers, (ii) the escape of the carriers, and (iii) the sweep out and collection of the escaped carriers. By having a high enough doping to have a scattering length similar to the emitter thickness $d_e$, the carriers will scatter before the wave function can interfere with itself and hence will not form discreet quantum states inside the well. This makes the carrier distribution in the emitter 110 three-dimensional but still bound.

Figure 3:
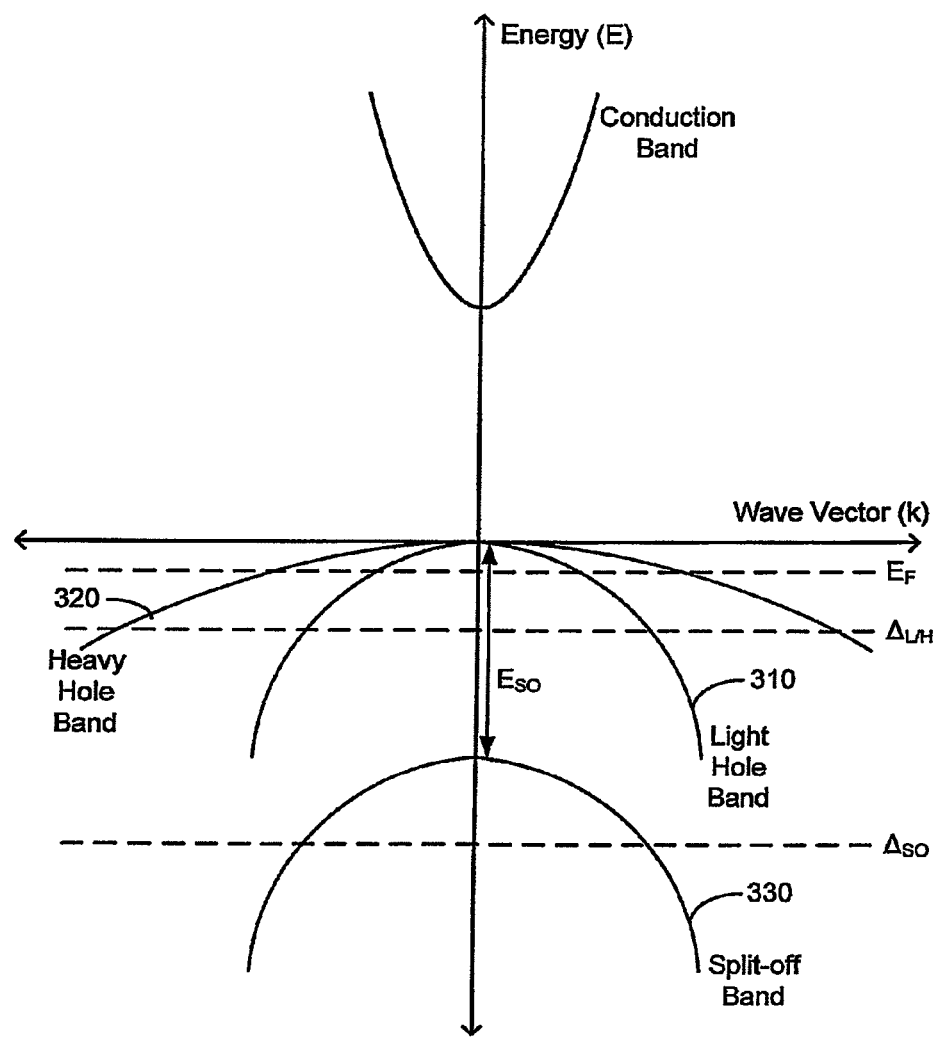
FIG. 3 is an illustration of a k-p bandstructure diagram used to describe IR detection mechanisms.

FIG. 3 is an illustration of a k-p bandstructure diagram used to describe IR detection mechanisms. In explaining the detection mechanisms, three bands will have to be considered, the light hole (L-H) band 310 and heavy hole (H-H) band 320, which are degenerate at k=0, and the split-off band 330, which is separated from them by an energy $E_{SO}$. Under equilibrium conditions, a p-doped region will have a Fermi level in the L-H and H-H bands, 310 and 320, respectively, but above the maximum of the split-off band 330. The four detection mechanisms include the standard free carrier absorption used in both homojunction and heterojunction detectors. The absorption involves free carrier transitions, which is different from the response in Si/SiGe detectors that use transitions from bound states to either a bound split-off band state or a continuum state including a mixture of the light, heavy and split-off hole bands. The Si/SiGe detectors are Quantum Well Infrared Photodetectors (QWIP) detectors operating in a bound-bound or bound-continuum mode. The other three detection mechanisms involve transitions between the hole bands that can occur for p-type detectors. Once the carrier is in the split-off band, it can escape directly or scatter back into the L-H and H-H bands, 310 and 320, respectively, and then escape.

Figure 4A:
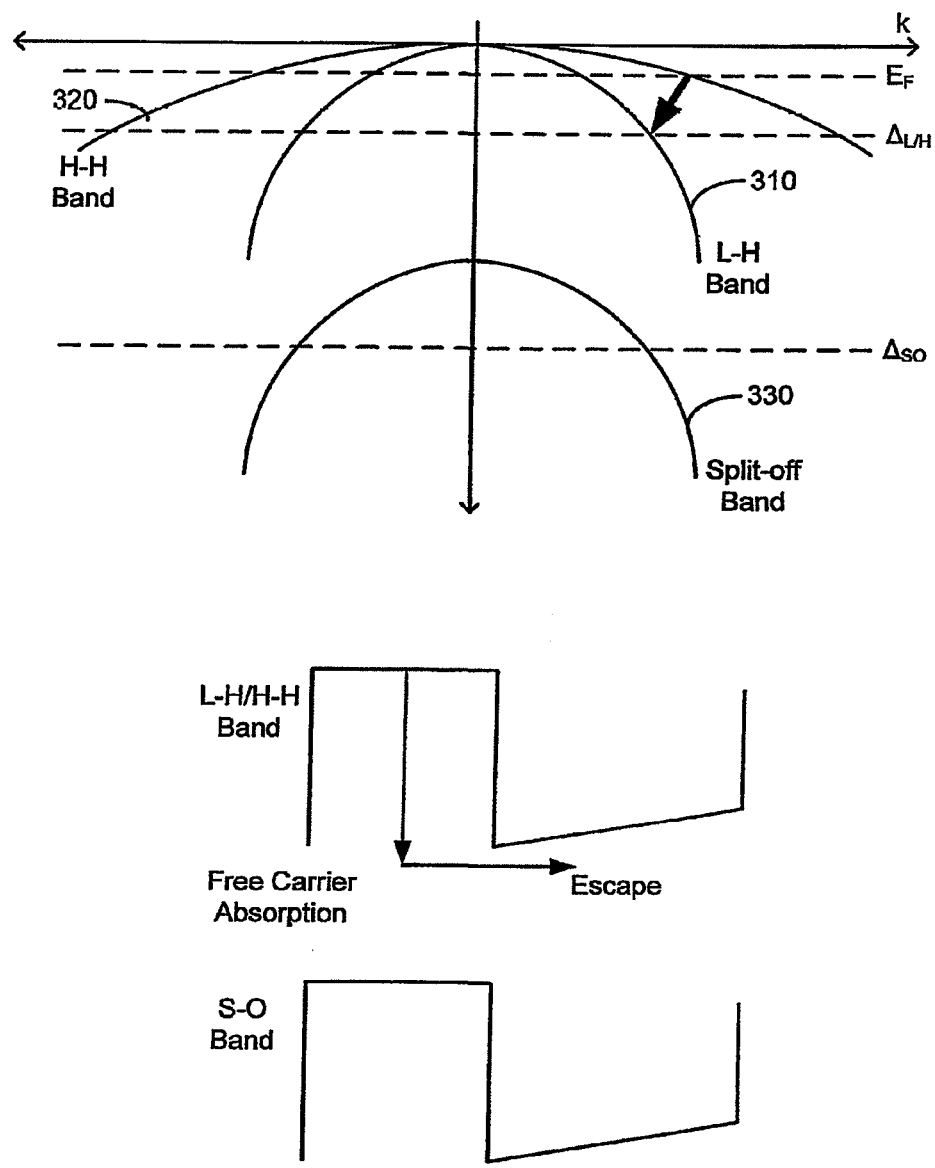
FIG. 4A is an illustration of free carrier absorption depicted on k-p bandstructure and p-type band diagrams.

FIG. 4A is an illustration of free carrier absorption depicted on k-p bandstructure and p-type band diagrams. For free carrier absorption in the emitter layers 110, the carriers remain in the L-H/H-H bands 310/320. An excited carrier then escapes from the emitter layer 110 by internal photoemission at the interface 115 between the emitters 110 and barriers 120.

Figure 4B:
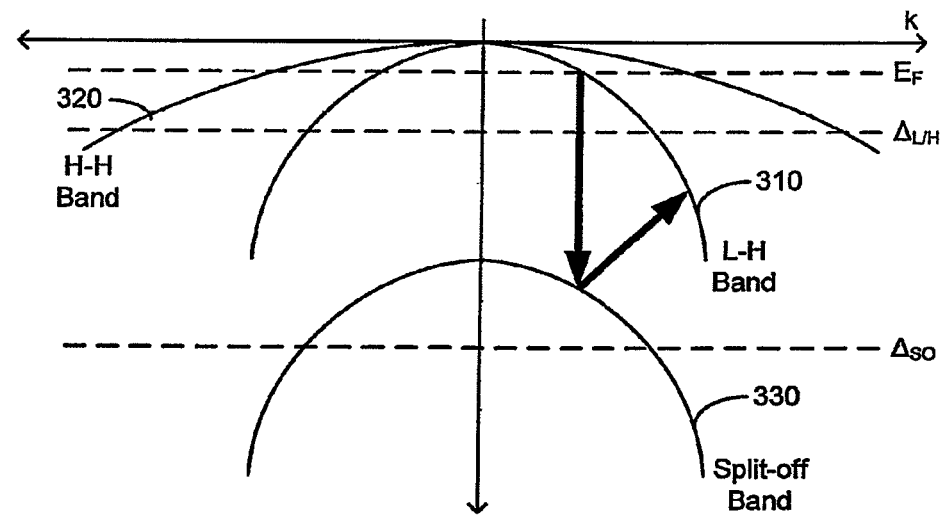
FIG. 4B is an illustration of direct photoabsorption to the split-off band followed by scattering to the L-H/H-H band depicted on k-p bandstructure and p-type band diagrams.
Figure 4B:
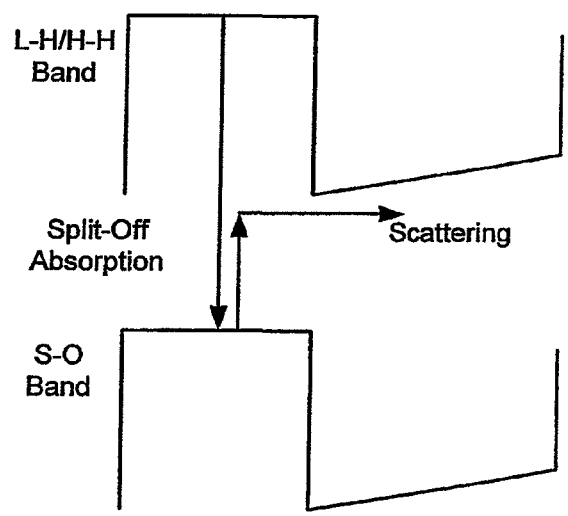

FIG. 4B is an illustration of direct photoabsorption to the split-off band followed by scattering to the L-H/H-H bands depicted on k-p bandstructure and p-type band diagrams. If the transition between the L-H/H-H bands 310/320 and the split-off band 330 is direct, the final energy of the excited carrier will not allow it to escape from the emitter 110 while remaining in the split-off band 330. This is due to the energy of states in the split-off band 330 with $k<k_f$ where $k_f$ corresponds to the Fermi level in the heavy hole band 320 being above the barrier in the split-off band 330. The carrier will scatter out of the split-off band 330 back to the L-H/H-H bands 310/320 with an excited energy, and then will be able to escape by a process via the standard mechanism. Because of the occupation in the L-H/H-H bands 310/320, this scattering time can be faster than that of a direct relaxation.

Figure 4C:
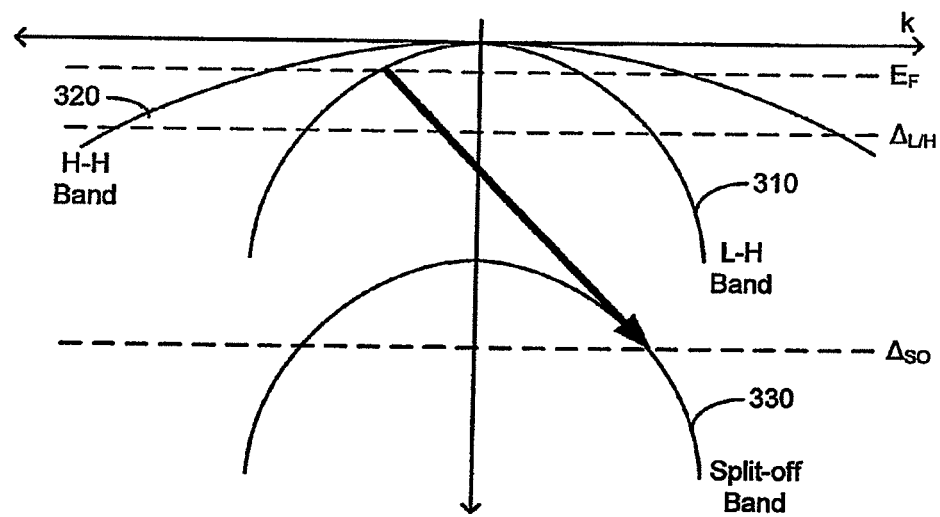
FIG. 4C is an illustration of indirect photoabsorption to the split-off band depicted on k-p bandstructure and p-type band diagrams.
Figure 4C:
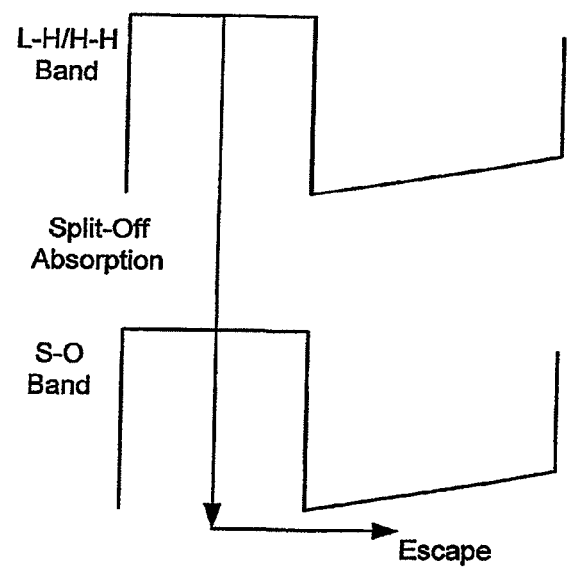

FIG. 4C is an illustration of indirect photoabsorption to the split-off band depicted on k-p bandstructure and p-type band diagrams. For an indirect transition, the excited carrier can have $k>k_f$ wherein the carrier can have sufficient energy to escape directly from the split-off band 330. In this case, the escape process will be similar to that of free carrier absorption illustrated in FIG. 4A.

Figure 4D:
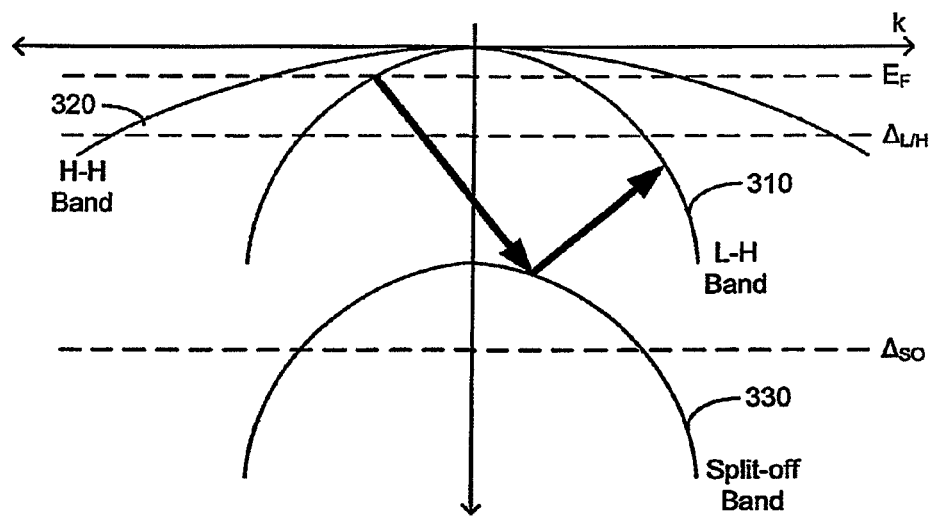
FIG. 4D is an illustration of indirect photoabsorption to the split-off band followed by scattering to the L-H/H-H bands depicted on k-p bandstructure and p-type band diagrams.
Figure 4D:
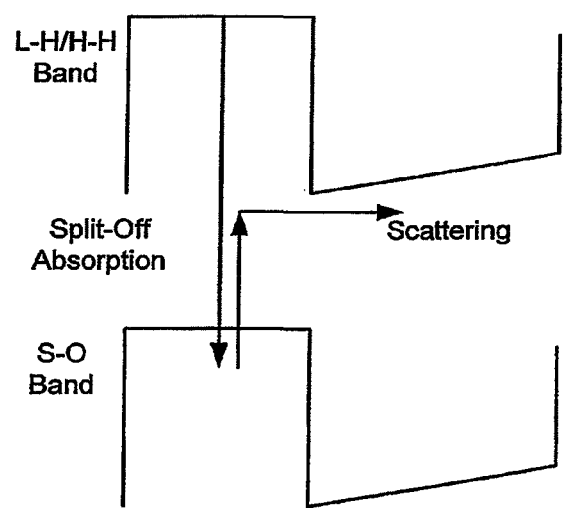

FIG. 4D is an illustration of indirect photoabsorption to the split-off band followed by scattering to the L-H/H-H bands depicted on k-p bandstructure and p-type band diagrams. For indirect transitions in which the carriers do not end up in an escape cone, it is still possible to go through the scattering process as in FIG. 4B in order to escape. Here, an indirect photoabsorption is followed by a scattering event to the L-H/H-H bands 310/320. The internal photoemission then occurs in the L-H/H-H bands 310/320. This provides an additional escape route for carriers in indirect photoabsorption that are not in the escape cone, as well as allowing carriers resulting from absorption of lower energy photons that would not have any possibility of escape in the split-off band 330. The threshold here is determined by the difference between the Fermi energy and the split-off band edge.

Two detectors were used in a study of the split-off absorption effects. The split-off response is first shown using a detector designed for the about 10-15 μm range with about a 20 μm threshold. The detector HE0204 design includes 16 periods of p-doped 188 Å GaAs emitters doped to $10^{18}$ cm$^{-3}$ with carbon and 1250 Å $Al_{0.12}Ga_{0.88}As$ barriers. The top and bottom contacts are $1\times10^{19}$ cm$^{-3}$ p-doped GaAs layers with 0.2 and 0.7 μm thicknesses, respectively. For doping values used in these detectors the scattering length is about 200 Å, close to thickness of the emitter.

Figure 5:
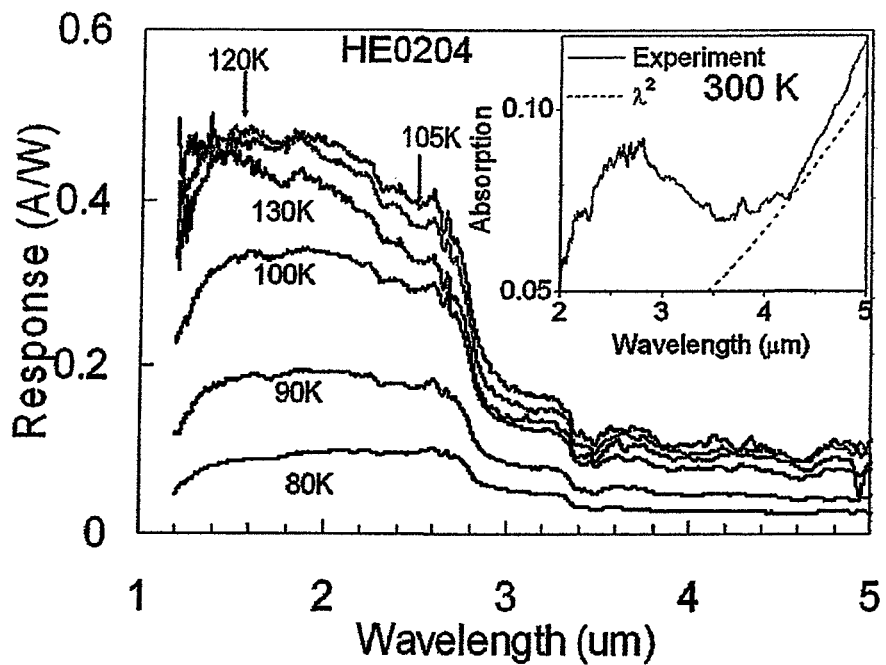
FIG. 5 is a plot that illustrates the measured responsivity and the expected and measured absorption of a first exemplary SPIP detector.

FIG. 5 is a plot that illustrates the measured responsivity and the expected and measured absorption of a first exemplary SPIP detector. The measured responsivity in the 1.2-5 μm split-off range for detector HE0204 at 79-130 K is shown in FIG. 5 A peak response of 0.45 A/W was measured at 105 K at 2.0 μm. As the temperature was increased from 105 K to 130 K, the response decreased. The increase in response with temperature may relate to phonon effects on the escape rate for excited carriers. The conversion efficiency determined by dividing the photocurrent by the incident photon rate was about 27, and at 1.8 μm a specific detectivity (D*) of $2.2\times10^{7}$ Jones was obtained at 90K. This value is low because the design of these detectors was for operation at much lower temperatures. The increased barrier in an optimized detector should reduce the dark current and hence improve specific detectivity (D*). The two steps seen in the response at about 2.8 and 3.4 μM may be caused by the thresholds for the split-off absorption illustrated in FIGS. 4B, 4C and 4D. This indicates that the use of high doping may be the preferred approach. A small signature could be identified at about 3.7 μm, which may be a signature of the bound heavy-light hole to bound split-off transitions.

Based on other experimental results and thermionic current calculations, the dark current should not increase significantly as doping is increased until defect assisted tunneling dominates. If the doping is kept below these high values, the absorption is increased, and the response and the background limited performance (BLIP) temperature should therefore increase.

Figure 6:
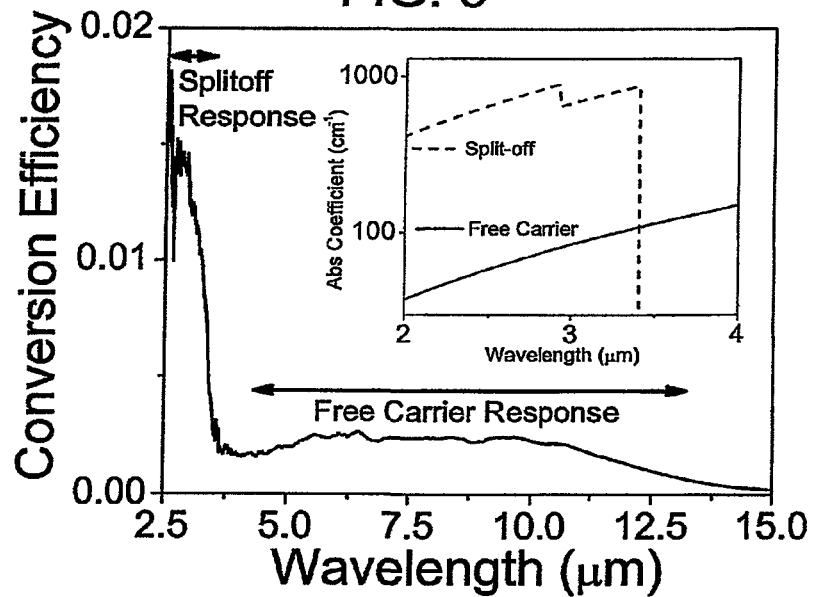
FIG. 6 is a plot that illustrates the measured conversion efficiency and calculated absorption coefficient of a second exemplary SPIP detector.
Figure 7A:
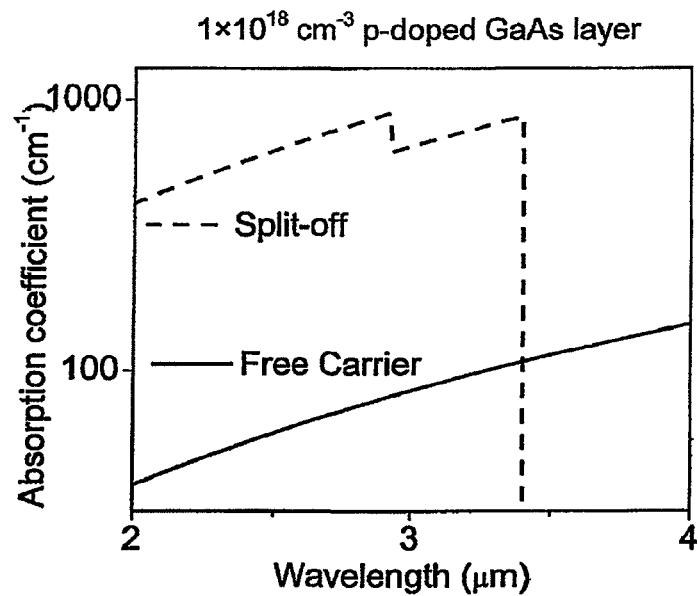
FIGS. 7A through 7E are plots illustrating the calculated absorption coefficient for the split-off band absorptions in $1 \times 10^{18}$ cm$^{-3}$ p-doped GaAs, InP, AlP, AlN, and GaN layers, respectively.
Figure 7B:
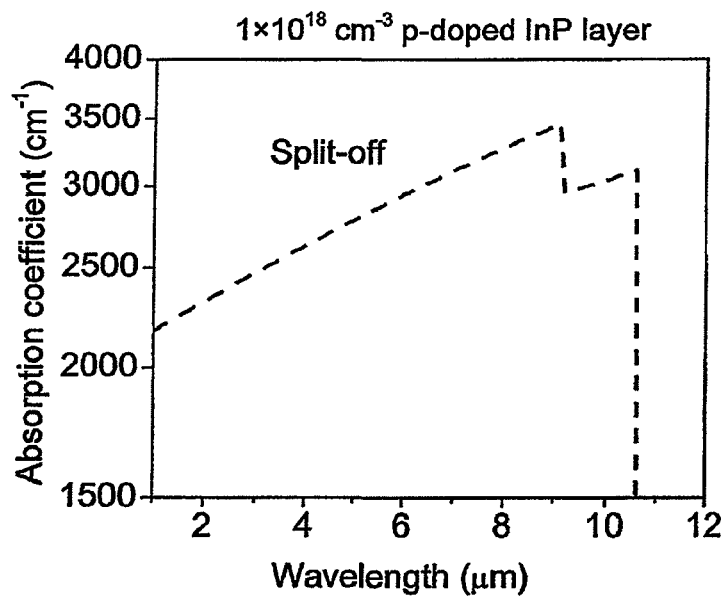
Figure 7C:
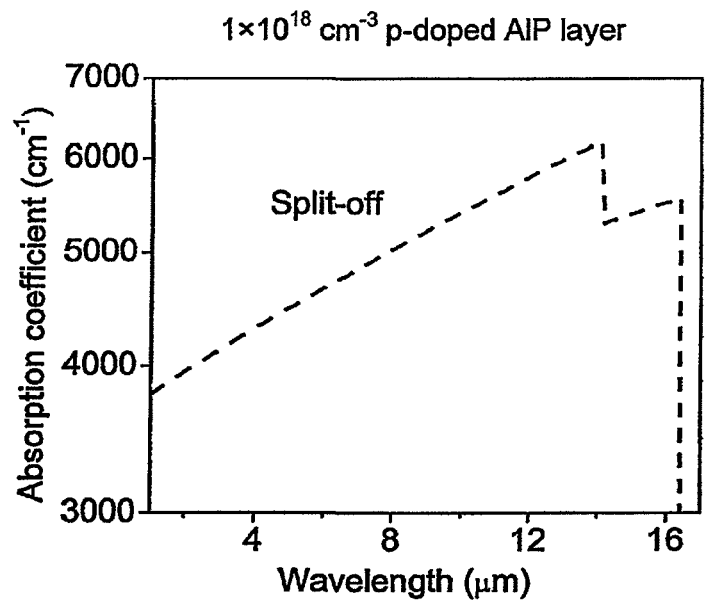
Figure 7D:
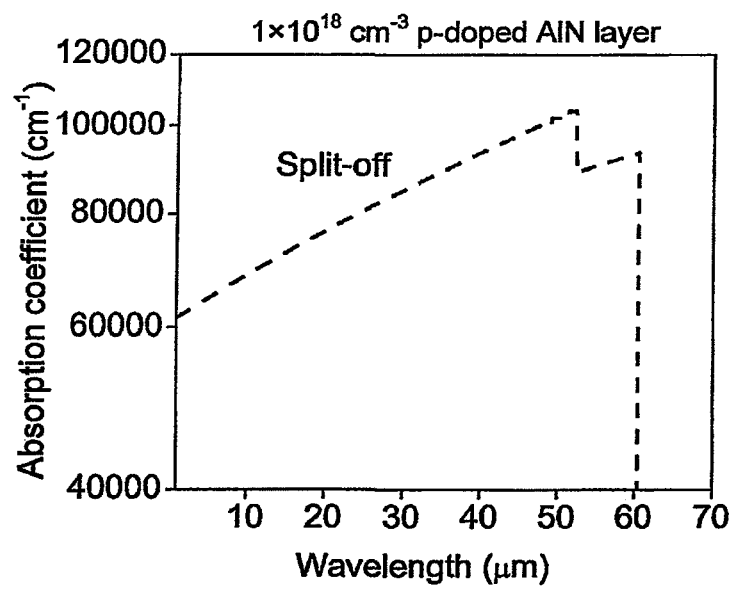
Figure 7E:
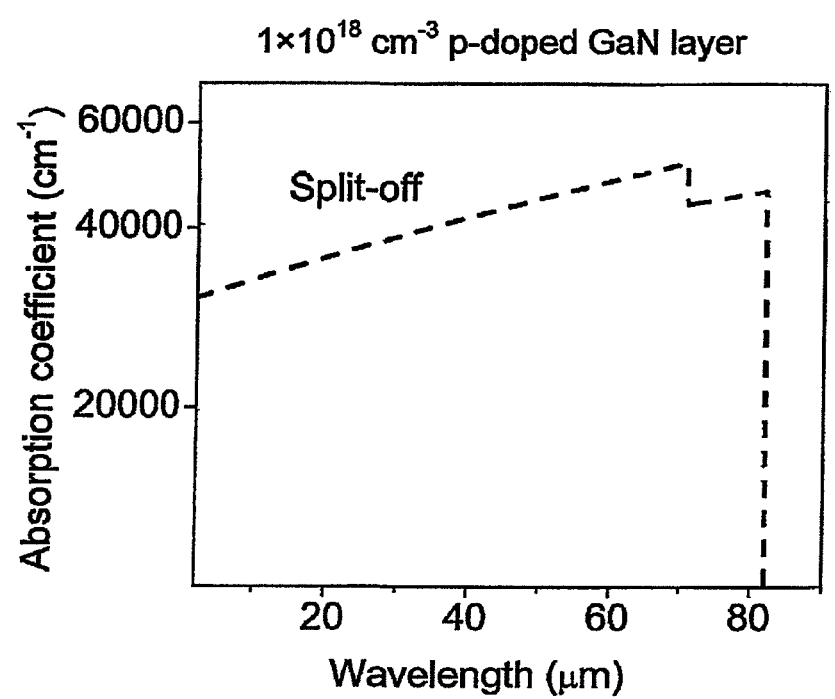

FIG. 6 is a plot that illustrates the measured responsivity and calculated absorption coefficient of a second exemplary SPIP detector. An alternative detector can include 16 periods with about $3.6\times10^{18}$ cm$^{-3}$ and about $1.2\times10^{18}$ cm$^{-3}$ Be-doped top contact and emitters, respectively. The conversion efficiency of the alternative detector at about 50 K and a bias field of about 3 kV/cm is shown in FIG. 6. The broad response from about 5-15 μm is due to the free carrier absorption and the sharp peak at about 2-4 μm is due to the split-off response. This increased conversion efficiency is due to the increased absorption/emission in the split-off region. For free carrier and indirect absorption response, i.e. detection mechanisms illustrated in FIGS. 4A, 4C, and 4D, a phonon or an impurity scattering event is required in the absorption to conserve momentum, while in the direct absorption response illustrated in FIG. 4B and indirect absorption response illustrated in FIG. 4D, a scattering event is also required. Since the detection mechanism illustrated in FIG. 4D requires two extra particles, it should be slower than the other three. The threshold for the indirect absorption response illustrated in FIG. 4C will be shorter than for the detection mechanisms illustrated in FIGS. 4B and 4D due to the requirement of passing the barrier in the split-off band. Based on the width and two thresholds in the split-off response, both direct and indirect absorptions are occurring in the split-off response.

In order to understand the strong response observed using the split-off band, calculations were carried out to determine the relative absorptions for the free carrier and split-off responses. The first step was to use a k-p model, similar to that used in quantum dot and quantum well analysis, to calculate the L-H, H-H and split-off hole energy bands. The absorption coefficient was then calculated as a function of photon energy (hω) from the energy states in the bands. The calculation was done for about a 1 μm thick GaAs layer that was p-doped to about $1\times10^{18}$ cm$^{-3}$. The absorption by the split-off band was over an order of magnitude larger than for the free carrier absorption in the L-H/H-H bands, as shown in the inset of FIG. 6, indicating the relative improvement of the split-off mechanism in this range. Similarly, the measured absorption is increased in the split-off region compared to the expected free carrier absorption as shown in the insert of FIG. 5. The experimental conversion efficiency is larger than the calculated conversion efficiency (even with the increased experimental absorption taken into account). This difference may be caused by the gain resulting from the large split-off energy (about 340 meV) for GaAs. The high energy for carriers that have been excited into the split-off band means they will have sufficient energy to excite additional carriers via impact effects, introducing a high gain factor into the detectors. The step seen in the response at about 3.4 μm is in good agreement with the calculated results shown in the inset to FIG. 6. However, there is a small discrepancy with the drop calculated to occur at about 2.9 μm. The experimental step is about 0.15 μm wide (possibly due to the effects of the photoemission process) and the threshold may be longer than it appears in FIG. 5.

The tested devices with a threshold in the range of about 20 μm had a maximum operating temperature of about 130 K. By reducing the threshold to about 5 μm, the operating temperature can increased to about 300 K with D* of ~$5\times10^9$ Jones. The response can be adjusted by increasing the number of layers in order to get increased absorption and using surface plasmon resonances in metallic nanoparticles deposited on the detector. A device designed to work at and above room temperature may compete with currently available uncooled detectors. Materials other than GaAs/AlGaAs may lead to improved coverage of the about 3-5 μm range. A direct transition to the split-off band for phosophate materials gives a threshold in the range of about 11 to 18 μm, while the nitride materials may be able to operate in ranges of about 60 to 410 μm in the split-off mode. The split-off band offset energy and potential threshold wavelengths are indicated in TABLE 1, below. In addition, FIGS. 7A through 7E are plots illustrating the calculated absorption coefficient for the split-off band absorptions in $1\times10^{13}$ cm$^{-3}$ p-doped GaAs, InP, AlP, AlN, and GaN emitter layers, respectively.

TABLE 1

| Material | $\Delta_{SO}$ (meV) | $\Delta_{SO}$ (μm) |
|---|---|---|
| InN | 3 | 410 |
| GaN | 20 | 62 |
| AlN | 19 | 65 |
| InP | 108 | 11 |
| GaP | 80 | 16 |
| AlP | 70 | 18 |
| InAs | 390 | 3.2 |
| GaAs | 340 | 3.6 |
| AlAs | 280 | 4.4 |

Double and/or Graded Barrier:

As noted above, a limiting factor on the quantum efficiency, or gain, of the SPIP detector described in the '464 application, may be the trapping of carriers due to the scattering between hot and cold carriers as they pass through the emitter layers of the detector. In order to address this, embodiments of the present invention provide a high operating temperature split-off band infrared or photodetector (SPIP) detector having a double and/or a graded barrier surrounding the emitter.

Figure 8:
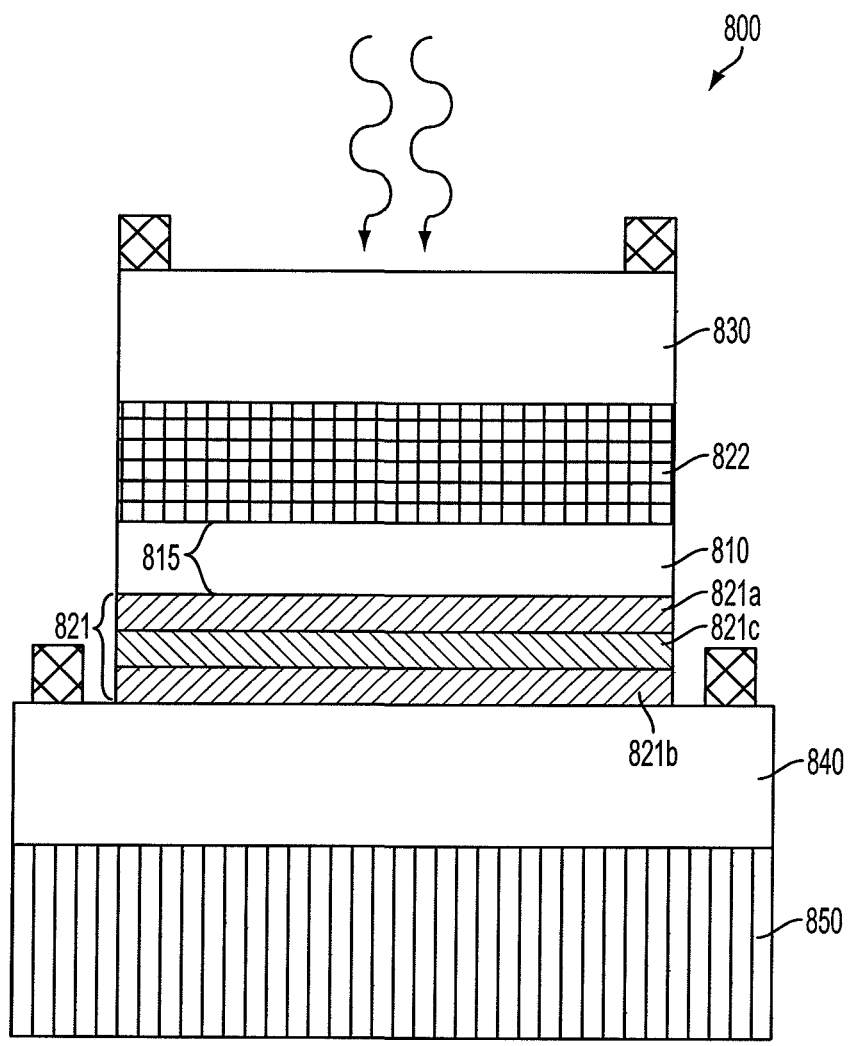
FIG. 8 illustrates a split-off infrared photodetector (SPIP) detector with graded and double barriers according to an embodiment described herein.
Figure 9:
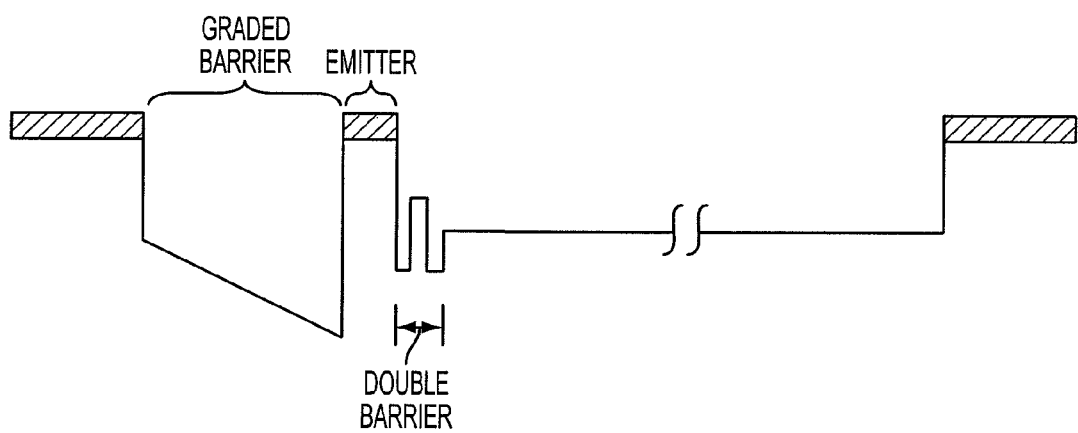
FIG. 9 is band diagram of one embodiment of the SPIP detector with graded and double barriers described herein.

In particular, reference is now made to FIGS. 8 and 9 which illustrate the structure and band diagram, respectively, of the SPIP detector 800 of one embodiment of the present invention. As shown, according to one embodiment, the SPIP detector 800 may, like the SPIP described in the '464 application, comprise an emitter 810 of a first semiconductor material (e.g., p-doped GaAs) and two barriers 821 and 822 of a different semiconductor material (e.g., AlGaAs), sandwiched between first and second contact layers 830 and 840. In one embodiment, the first barrier 821, or the barrier on the escape side of the emitter, may comprise a double barrier, wherein the double barrier may be designed to have its light-hole levels in resonance with the split-off band of the emitter. In another embodiment, the second barrier 822, or the barrier on the injection side of the emitter, may comprise a graded barrier, wherein the difference in height on either side of the emitter may give the injection carriers sufficient energy to pass over the emitter even after one or more scattering events.

While the SPIP detector illustrated in FIGS. 8 and 9 includes only a single emitter sandwiched between a graded and double barrier, as one of ordinary skill in the art will recognize in light of this disclosure, embodiments of the present invention are not limited to this particular structure. In contrast, the SPIP detector may include multiple periods of the emitter, graded barrier and double barrier without departing from the spirit and scope of embodiments described herein.

According to one embodiment, the graded barrier 822 of the SPIP detector 800 may be a layer of semiconductor material made from a first group III element (e.g., Al, Ga, In, etc.), a second group III element and a first group V element (e.g., N, P, As, Sb, etc.), wherein the amount or fraction of the first group III element may be graded. For example, according to one embodiment, the graded barrier 822 may be made of Al$_x$GaAs, wherein the Al fraction (x) may be graded. By grading the injection-side barrier, embodiments of the present invention can reduce the trapping and, therefore, increase the quantum efficiency of the SPIP detector 800.

While graded barriers have been used for other IR detectors, the grading in those cases is typically for the purpose of selecting the carrier energy between two different levels by using the applied bias to select the carrier transport direction. In the case of embodiments described herein, the barrier grading may be used to obtain the offset on the barriers on the two sides of the emitter layer. While this offset could be created without grading for a single-emitter SPIP detector, it could not for a multiple-emitter SPIP detector.

In one embodiment, the double barrier 821 may include two sub-barriers 821a and 821b of one semiconductor material separated by a layer of a different semiconductor material forming a well 821c between the two sub-barriers 821a and 821b. According to one embodiment, the height of the sub-barriers, and/or the thickness and/or base level of the well, may be adjusted in order to provide resonance with the split-off energy band level of the emitter 810. Specifically, reducing the thickness of the well and/or increasing the height of the sub-barriers may increase the light-hole energy level of the double barrier, and vice versa, such that the light-hole energy level can be aligned with the split-off energy band of the emitter.

In one embodiment, the height of the sub-barriers and the base level of the well may be adjusted by adjusting the semiconductor material makeup of those layers. For example, according to one embodiment, like the graded barrier, the sub-barriers and well may each include a layer of a semiconductor material including a first and second group III element (e.g., Al, Ga, In, etc.) and a first group V element (e.g., N, P, As, Sb, etc.). In this embodiment, in order to adjust the height of the sub-barrier, as well as the base level of the well, the amount or fraction of the first group III element may be adjusted. For example, according to one embodiment, the semiconductor material of the sub-barriers may comprise Al$_x$Ga$_{1-x}$As, while the semiconductor material used for the well may comprise Al$_{1-x}$Ga$_x$As, where x is a number satisfying $0<x<1$, and wherein the Al fraction of the sub-barriers (x) and the well (1−x) may be adjusted in order to adjust the barrier height and the well base level, respectively. In particular, by increasing (decreasing) the Al fraction of the sub-barrier, the height of the sub-barrier may be increased (decreased). Similarly, by increasing (decreasing) the Al fraction of the well, the base level of the well may increase (decrease).

According to embodiments of the present invention, by resonating the light-hole level of the double barrier with the split-off band of the emitter, carriers may be able to more easily escape from the split-off band to the light-hole/heavy-hole band. This can result in an increase in the collection of carriers and, therefore, an improved quantum efficiency of the SPIP detector.

While other techniques that do not use a double barrier may exist for enhancing the escape of carriers, the ability to fine tune the resonance using bias may make the double barrier approach of embodiments described herein less sensitive to variations in the semiconductor material makeup (e.g., the Al fraction).

While double barriers have been used in other types of IR detectors (e.g., quantum dot detectors), the double barrier of the SPIP detectors of embodiments described herein provides a different function. In particular, the double barriers of other types of IR detectors are likely used to selectively block dark current by only allowing current at a specific discrete level that is associated with the photo current to pass. By resonating the entire band, embodiments of the present invention do not selectively block dark current. Instead, all carriers (representing dark and photo current) have enhanced escape movement.

Model of SPIP with Double and Graded Barrier

A model of the high-operating temperature split-off band IR, or photodetector, (SPIP) detector with the double barrier and graded barrier of embodiments described herein was developed and successfully tested with experimental values obtained for three samples. The results of fitting the model for a sample with a 4 μm free carrier threshold for different biases at 300 and 330K, respectively are shown in FIGS. 10A and 10B. For the optimized design, a single emitter was used with the emitter placed 100 nm from the injection contact. The Al fraction first barrier was graded from x=0.57 to x=0.95 to reduce trapping in the emitter and increase the gain factor. The emitter was 20 nm thick and doped to $1 \times 10^{19}$ cm$^{-3}$. The second barrier was a double barrier including two 5 nm $Al_{0.65}Ga_{0.35}As$ layers separated by a 3 nm $Al_{0.35}Ga_{0.65}As$ layer followed by a 400 nm thick $Al_{0.5}Ga_{0.5}As$ barrier layer.

A comparison of the SPIP detector with and without the double and graded barriers is shown in FIG. 11. The calculated response for the SPIP detector with double and graded barriers is shown in FIG. 12. As shown, the design of embodiments described herein gave a peak conversion efficiency of 210% at 2.9 μm. Varying the scattering length by 5 nm would likely produce only a ~10% variation in the response with only minimal changes in the spectral shape. A design without the graded barrier may have a much lower response but would also likely have a lower dark current, possibly leading to increased normalized detectivity.

Method of Making an SNP with Graded and Double Barriers

Referring now to FIG. 13 (with reference also to FIG. 8), the operations are illustrated that may be taken in order to make an SPIP detector with graded and double barrier in accordance with an embodiment of the present invention. As shown, the process may begin at Block 1301 when a substrate 850 of a first semiconductor material is provided. In one embodiment, the substrate may be of a material compatible with the material from which the emitter 810 and barriers 821 and 822 are made but may be either doped or undoped. Next, at Block 1302, a first contact layer 840 may be disposed on the substrate 150. In one embodiment, the first contact layer 840 may be of a material substantially identical to the material from which the emitter 810 is made.

Next, a first barrier 821 may be disposed on the first contact layer 840. In particular, according to one embodiment, the first barrier 821 may be a double barrier comprising a well 821c sandwiched between two sub-barriers 821a and 821b. In this embodiment, in order to dispose the double barrier 821 on the first contact layer 840, a first sub-barrier 821a (e.g., made of $Al_xGa_{(1-x)}As$) may first be disposed on the first contact layer. (Block 1303). The well 821c may then be formed, at Block 1304, by disposing a layer of a different semiconductor material (e.g., $Al_{(1-x)}Ga_xAs$) on the first sub-barrier 821a. Finally, at Block 1305, a second sub-barrier 821b of a substantially identical material as the first sub-barrier 821a, may be disposed on the well. As noted above, one or more of the height of the sub-barriers 821a and 821b (as determined by the material makeup of the sub-barriers), the base level of the well (as determined by the material makeup of the well), and/or the thickness of the well may be selected in order to align the light-hole energy band level of the double barrier 821 with the split-off energy band level of the emitter 810.

Once the first barrier 810 has been formed, an emitter 810 may, at Block 1306, be disposed on the first barrier 821 to form a heterojunction at a first interface 815 between the emitter 810 and the first barrier 821. The emitter may include a layer of material made from first and second group III elements (e.g., Al, Ga, In, and combinations thereof) and a first group V element (e.g., N, P, As, Sb, and combinations thereof). The emitter may further be characterized as having a bandgap that is different from that of the first and second barriers 821 and 822. In addition, the emitter may be doped to cause free carriers in the emitter by adding a doping element including, but not limited to, group II elements (e.g., Be, Mg, and combinations thereof) and/or group IV elements (e.g., C, Si, Ge, Sn, and combinations thereof).

Next a second barrier 822 may then be disposed on the emitter 810 to form a heterojunction at a second interface 815. (Block 1307). As discussed above, in one embodiment, the second barrier 822 may, for example, be made of AlGaAs with a graded Al fraction.

While not shown, at this point, Blocks 1303-1307 may be repeated in order to form an SPIP detector having multiple periods of the double barrier, emitter and graded barrier. Once the desired number of periods have been created, the process may continue at Block 1308 when a second contact layer 830 is disposed on the second, or graded, barrier 822. In one embodiment, like the first contact layer 840, the second contact layer 830 may be made from a material that is substantially identical to the material from which the emitter 810 is made. In addition, depending on the doping required for ohmic contacts, the second contact layer 830 may also server as a top emitter layer.

Conclusion:

While the foregoing embodiments of the high-operating temperature SPIP detector use GaAs/AlGaAs, as one of ordinary skill in the art will recognize in light of this disclosure, materials other than GaAs/AlGaAs may likewise be used. In fact, other materials my help to extend the coverage to longer wavelengths. For example, materials such as phosphides (with a threshold of ~18 μm) and nitrides may be able to operate at 60 μm or beyond at elevated temperatures. A possible dual-band detector design could cover 3-5 μm and 8-14 μm atmospheric windows using a combined system with arsenides and phosphides Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A photodetector comprising:
    a first and a second barrier; and
    an emitter disposed between the first and second barriers so as to form a heterojunction at each interface between the emitter and the first and second barriers, respectively, the emitter comprising a first semiconductor material having a split-off response to optical signals,
    wherein one of the first or the second barrier comprises a double barrier having a light-hole energy band level aligned with a split-off energy band level of the emitter.

2. The photodetector of claim 1, wherein the double barrier further comprises:
    a first and a second sub-barrier, respective sub-barriers comprising a second semiconductor material having a first bandgap; and
    a well disposed between the first and second sub-barriers, said well comprising a third semiconductor material having a second bandgap.

3. The photodetector of claim 2, wherein the first and second sub-barriers are of a height selected in order to align the light-hole energy band level of the double barrier with the split-off energy band level of the emitter.

4. The photodetector of claim 3, wherein the well is of a base level and thickness selected in order to align the light-hole energy band level of the double barrier with the split-off band energy level of the emitter.

5. The photodetector of claim 4, wherein the second and third semiconductor materials comprise a first group III element selected from a group consisting of Al, Ga, In, and combinations thereof, a second group III element selected from a group consisting of Al, Ga, In, and combinations thereof, and a first group V element selected from a group consisting of N, P, As, Sb, and combinations thereof.

6. The photodetector of claim 5, wherein the height of the first and second sub-barriers is selected by adjusting a fraction of the first group III element in the second semiconductor material, and the base level of the well is selected by adjusting a fraction of the first group III element in the third semiconductor material.

7. The photodetector of claim 6, wherein the second semiconductor material is $Al_xGa_{(1-x)}As$ and the third semiconductor material is $Al_{(1-x)}Ga_xAs$, wherein $0<x<1$.

8. The photodetector of claim 1, wherein the first barrier comprises a graded barrier.

9. The photodetector of claim 8, wherein the graded barrier is of a fourth semiconductor material comprising a first group III element selected from a group consisting of Al, Ga, In, and combinations thereof, a second group III element selected from a group consisting of Al, Ga, In, and combinations thereof, and a first group V element selected from a group consisting of N, P, As, Sb, and combinations thereof.

10. The photodetector of claim 9, wherein the fourth semiconductor material comprises $Al_xGaAs$, wherein $0<x<1$ and x is graded.

11. A photodetector comprising:
    a first and a second barrier; and
    an emitter disposed between the first and second barriers so as to form a heterojunction at each interface between the emitter and the first and second barriers, respectively, the emitter comprising a first semiconductor material having a split-off response to optical signals,
    wherein the first barrier is graded and the second barrier comprises a double barrier having a light-hole energy band level aligned with a split-off energy band level of the emitter.

12. The photodetector of claim 11, wherein the double barrier further comprises:
    a first and a second sub-barrier, respective sub-barriers comprising a second semiconductor material having a first bandgap; and
    a well disposed between the first and second sub-barriers, said well comprising a third semiconductor material having a second bandgap.

13. The photodetector of claim 12, wherein the first and second sub-barriers are of a height selected in order to align the light-hole energy band level of the double barrier with the split-off band level of the emitter.

14. The photodetector of claim 13, wherein the well is of a base level and thickness selected in order to align the light-hole energy band level of the double barrier with the split-off band level of the emitter.

15. The photodetector of claim 14, wherein the second and third semiconductor materials comprise a first group III element selected from a group consisting of AL, Ga, In, and combinations thereof, a second group III element selected from a group consisting of Al, Ga, In and combinations thereof, and a first group V element selected from a group consisting of N, P, As, Sb, and combinations thereof, and wherein the height of the first and second sub-barriers is selected by adjusting a fraction of the first group III element of the second semiconductor material, and the base level of the well is selected by adjusting a fraction of the first group III element of the third semiconductor material.

16. The photodetector of claim 15, wherein the second semiconductor material is $Al_xGa_{(1-x)}As$ and the third semiconductor material is $Al_{(1-x)}Ga_xAs$, wherein $0<x<1$.

17. The photodetector of claim 11, wherein the graded barrier is of a fourth semiconductor material comprising a first group III element selected from a group consisting of Al, Ga, In, and combinations thereof, a second group III element selected from a group consisting of Al, Ga, In, and combinations thereof, and a first group V element selected from a group consisting of N, P, As, Sb, and combinations thereof.

18. The photodetector of claim 11, wherein the fourth semiconductor material comprises $Al_xGaAs$, wherein $0<x<1$ and x is graded.

19. A method of making a photodetector comprising:
    providing a first barrier;
    disposing an emitter on the first barrier to form a heterojunction at a first interface between the emitter and the first barrier, the emitter comprising a first semiconductor material having a split-off response to optical signals and the first barrier comprising a double barrier having a light-hole energy band level aligned with a split-off energy band level of the emitter; and
    disposing a second barrier on the emitter to form a heterojunction at a second interface between the emitter and the second barrier, the second barrier comprising a graded second semiconductor material.

20. The method of claim 19, wherein providing the first barrier further comprises:
    providing a first sub-barrier comprising a third semiconductor material having a first bandgap;

disposing a layer of a fourth semiconductor material on the first sub-barrier to form a well, the fourth semiconductor material having a second bandgap; and disposing a second sub-barrier on the well, the second sub-barrier comprising the third semiconductor material having the first bandgap.

21. The method of claim 20 further comprising:

selecting a height of the first and second sub-barriers and a base level of the well in order to align the light-hole energy band level of the double barrier with the split-off band energy level of the emitter.

22. The method of claim 21, wherein the third and fourth semiconductor materials comprise a first group III element selected from a group consisting of Al, Ga, In, and combinations thereof, a second group III element selected from a group consisting of Al, Ga, In, and combinations thereof, and a first group V element selected from a group consisting of N, P, As, Sb, and combinations thereof, and wherein selecting a height of the first and second sub-barriers further comprises adjusting a fraction of the first group III element in the third semiconductor material, and selecting a base level of the well further comprises adjusting a fraction of the first group III element in the fourth semiconductor material.

23. The method of claim 21 further comprising:

selecting a thickness of the well in order to align the light-hole energy band level of the double barrier with the split-off band level of the emitter.

* * * * *

UNITED STATES PATENT AND TRADEMARK OFFICE
CERTIFICATE OF CORRECTION

| | | |
|---|---|---|
| PATENT NO. | : 8,530,995 B2 | Page 1 of 1 |
| APPLICATION NO. | : 13/147646 | |
| DATED | : September 10, 2013 | |
| INVENTOR(S) | : A. G. Unil Perera et al. | |

It is certified that error appears in the above-identified patent and that said Letters Patent is hereby corrected as shown below:

In the Specification

Add the following at column 1, line 16:

STATEMENT REGARDING FEDERALLY SPONSORED RESEARCH OR DEVELOPMENT

This invention was made with government support under agreement W911NF-08-1-0448 awarded by the Army Research Office. The Government has certain rights in the invention.

Signed and Sealed this
Tenth Day of February, 2015

Michelle K. Lee
*Deputy Director of the United States Patent and Trademark Office*

UNITED STATES PATENT AND TRADEMARK OFFICE
CERTIFICATE OF CORRECTION

PATENT NO. : 8,530,995 B2  Page 1 of 1
APPLICATION NO. : 13/147646
DATED : September 10, 2013
INVENTOR(S) : Perera et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 237 days.

Signed and Sealed this

Fifteenth Day of September, 2015

Michelle K. Lee
*Director of the United States Patent and Trademark Office*